United States Patent
Rains (10) Patent No.: US 7,144,131 B2
(45) Date of Patent: Dec. 5, 2006

(54) OPTICAL SYSTEM USING LED COUPLED WITH PHOSPHOR-DOPED REFLECTIVE MATERIALS

(75) Inventor: Jack C. Rains, Herndon, VA (US)

(73) Assignee: Advanced Optical Technologies, LLC, Herndon, VA (US)

( * ) Notice: Subject to any disclaimer, the term of this patent is extended or adjusted under 35 U.S.C. 154(b) by 204 days.

(21) Appl. No.: 10/951,630

(22) Filed: Sep. 29, 2004

(65) Prior Publication Data
US 2006/0072314 A1    Apr. 6, 2006

(51) Int. Cl.
*F21V 9/16*   (2006.01)
*F21V 7/22*   (2006.01)

(52) U.S. Cl. ............... 362/231; 362/84; 362/298; 362/301

(58) Field of Classification Search .......... 362/84, 362/230, 231, 260
See application file for complete search history.

(56) References Cited

U.S. PATENT DOCUMENTS

| | | | |
|---|---|---|---|
| 4,677,533 A | 6/1987 | McDermott et al. | |
| 4,962,687 A | 10/1990 | Belliveau et al. | |
| 4,992,704 A | 2/1991 | Stinson | |
| 5,241,459 A | 8/1993 | Kaplan et al. | |
| 5,365,084 A | 11/1994 | Cochran et al. | |
| 5,400,228 A | 3/1995 | Kao | |
| 5,420,482 A | 5/1995 | Phares | |
| 5,453,849 A * | 9/1995 | Copenhaver et al. | ....... 358/475 |
| 5,471,052 A | 11/1995 | Ryczek | |
| 5,548,493 A * | 8/1996 | Young | .......... 362/84 |
| 5,650,843 A | 7/1997 | Moberg et al. | |
| 5,705,804 A | 1/1998 | Ramer et al. | |
| 5,733,028 A | 3/1998 | Ramer et al. | |
| 5,752,766 A | 5/1998 | Bailey et al. | |
| 5,757,111 A * | 5/1998 | Sato | ............ 313/111 |
| 5,773,819 A | 6/1998 | Ramer et al. | |
| 5,803,592 A * | 9/1998 | Lawson | ............ 362/300 |
| 5,838,247 A | 11/1998 | Bladowski | |
| 5,877,490 A | 3/1999 | Ramer et al. | |
| 5,877,849 A | 3/1999 | Ramer et al. | |

(Continued)

FOREIGN PATENT DOCUMENTS

JP    2000321126 A  * 11/2000

OTHER PUBLICATIONS

Rohwer, L. et al. "Development of Phosphors for LEDS" The Electrochemical Society, *Interface*, Summer 2003, pp. 36-39.

(Continued)

*Primary Examiner*—Alan Cariaso
(74) *Attorney, Agent, or Firm*—McDermott Will & Emery LLP (57) ABSTRACT

To improve semiconductor-based systems for generating white light, a phosphor is integrated into a reflective material of an external structure. A disclosed exemplary system, for luminance or illumination applications, utilizes an energy source package, for emitting radiant energy of a first wavelength. The package typically contains an LED or other semiconductor device. A reflector outside the package has a reflective surface arranged to receive radiant energy from the energy source. At least some of the received radiant energy of the first wavelength excites one or more phosphors doped within the reflector to emit visible light, including visible light energy of at least one second wavelength different from the first wavelength. At least some of visible light emitted by the phosphor is reflected by the reflective surface of the reflector and directed to facilitate the particular humanly perceptible luminance or illumination application.

33 Claims, 4 Drawing Sheets

U.S. PATENT DOCUMENTS

| | | |
|---|---|---|
| 5,886,351 A | 3/1999 | Ramer et al. |
| 5,899,557 A | 5/1999 | McDermott |
| 5,914,487 A | 6/1999 | Ramer et al. |
| 5,966,393 A | 10/1999 | Hide et al. |
| 5,967,652 A | 10/1999 | Ramer et al. |
| 6,007,225 A | 12/1999 | Ramer et al. |
| 6,016,038 A | 1/2000 | Mueller et al. |
| 6,043,873 A | 3/2000 | Ramer et al. |
| 6,064,061 A | 5/2000 | Ramer et al. |
| 6,084,250 A | 7/2000 | Justel et al. |
| 6,088,091 A | 7/2000 | Ramer et al. |
| 6,127,783 A | 10/2000 | Pashley et al. |
| 6,139,166 A | 10/2000 | Marshall et al. |
| 6,149,283 A | 11/2000 | Conway et al. |
| 6,150,774 A | 11/2000 | Mueller et al. |
| 6,166,496 A | 12/2000 | Lys et al. |
| 6,183,086 B1 | 2/2001 | Neubert |
| 6,184,628 B1 | 2/2001 | Ruthenberg |
| 6,200,002 B1 | 3/2001 | Marshall et al. |
| 6,211,626 B1 | 4/2001 | Lys et al. |
| 6,222,623 B1 | 4/2001 | Wetherell |
| 6,234,648 B1 * | 5/2001 | Borner et al. ........ 362/235 |
| 6,238,077 B1 | 5/2001 | Ramer et al. |
| 6,257,737 B1 | 7/2001 | Marshall et al. |
| 6,266,136 B1 | 7/2001 | Ramer et al. |
| 6,273,589 B1 | 8/2001 | Weber et al. |
| 6,280,054 B1 | 8/2001 | Cassarly et al. |
| 6,286,979 B1 | 9/2001 | Ramer et al. |
| 6,292,901 B1 | 9/2001 | Lys et al. |
| 6,299,329 B1 | 10/2001 | Mui et al. |
| 6,334,700 B1 | 1/2002 | Ramer et al. |
| 6,340,868 B1 | 1/2002 | Lys et al. |
| 6,342,695 B1 | 1/2002 | Ramer et al. |
| 6,357,893 B1 | 3/2002 | Belliveau |
| 6,441,558 B1 | 8/2002 | Muthu et al. |
| 6,459,919 B1 | 10/2002 | Lys et al. |
| 6,488,389 B1 | 12/2002 | Cassarly et al. |
| 6,523,977 B1 | 2/2003 | Chuang et al. |
| 6,525,668 B1 | 2/2003 | Petrick |
| 6,527,411 B1 | 3/2003 | Sayers |
| 6,528,954 B1 | 3/2003 | Lys et al. |
| 6,533,429 B1 | 3/2003 | Yoneda |
| 6,547,416 B1 | 4/2003 | Pashley et al. |
| 6,548,967 B1 | 4/2003 | Dowling et al. |
| 6,577,080 B1 | 6/2003 | Lys et al. |
| 6,607,794 B1 * | 8/2003 | Wilson et al. ........ 428/34.1 |
| 6,608,453 B1 | 8/2003 | Morgan et al. |
| 6,624,597 B1 | 9/2003 | Dowling et al. |
| 6,626,558 B1 | 9/2003 | Momot et al. |
| 6,636,003 B1 | 10/2003 | Rahm et al. |
| 6,659,622 B1 | 12/2003 | Katogi et al. |
| 6,686,691 B1 | 2/2004 | Mueller et al. |
| 6,692,136 B1 | 2/2004 | Marshall et al. |
| 6,700,112 B1 | 3/2004 | Brown |
| 6,717,376 B1 | 4/2004 | Lys et al. |
| 6,720,745 B1 | 4/2004 | Lys et al. |
| 6,744,223 B1 | 6/2004 | Laflamme et al. |
| 6,759,814 B1 | 7/2004 | Vogel et al. |
| 6,774,584 B1 | 8/2004 | Lys et al. |
| 6,777,891 B1 | 8/2004 | Lys et al. |
| 6,781,329 B1 | 8/2004 | Mueller et al. |
| 6,788,011 B1 | 9/2004 | Mueller et al. |
| 6,793,374 B1 | 9/2004 | Begemann |
| 6,801,003 B1 | 10/2004 | Schanberger et al. |
| 6,806,659 B1 | 10/2004 | Mueller et al. |
| 6,836,083 B1 | 12/2004 | Mukai |
| 6,840,652 B1 | 1/2005 | Hymer |
| 6,869,204 B1 | 3/2005 | Morgan et al. |
| 6,883,929 B1 | 4/2005 | Dowling |
| 6,888,322 B1 | 5/2005 | Dowling et al. |
| 6,897,624 B1 | 5/2005 | Lys et al. |
| 6,936,978 B1 | 8/2005 | Morgan et al. |
| 6,965,205 B1 | 11/2005 | Piepgras et al. |
| 6,967,448 B1 | 11/2005 | Morgan et al. |
| 6,969,954 B1 | 11/2005 | Lys |
| 6,975,079 B1 | 12/2005 | Lys et al. |
| 6,995,355 B1 | 2/2006 | Rains, Jr. et al. |
| 7,012,382 B1 | 3/2006 | Cheang et al. |
| 7,014,336 B1 | 3/2006 | Ducharme et al. |
| 7,031,920 B1 | 4/2006 | Dowling et al. |
| 7,038,398 B1 | 5/2006 | Lys et al. |
| 7,038,399 B1 | 5/2006 | Lys et al. |
| 7,042,172 B1 | 5/2006 | Dowling et al. |
| 7,064,498 B1 | 6/2006 | Dowling et al. |
| 2002/0064043 A1 | 5/2002 | Ariga et al. |
| 2003/0063462 A1 | 4/2003 | Shimizu et al. |
| 2003/0117796 A1 | 6/2003 | Voser |
| 2003/0193816 A1 | 10/2003 | Rahn |
| 2004/0012027 A1 | 1/2004 | Keller et al. |
| 2004/0095779 A1 | 5/2004 | Schottland et al. |
| 2004/0156199 A1 | 8/2004 | Rivas et al. |
| 2005/0040774 A1 | 2/2005 | Mueller et al. |
| 2005/0062446 A1 | 3/2005 | Ashdown |
| 2005/0063063 A1 | 3/2005 | Ashdown |
| 2005/0156103 A1 | 7/2005 | May et al. |
| 2005/0161586 A1 | 7/2005 | Rains et al. |
| 2006/0001381 A1 | 1/2006 | Robinson et al. |
| 2006/0028156 A1 | 2/2006 | Jungwirth |

OTHER PUBLICATIONS

Hirosaki, N. et al., "High Durable SiAION Phosphors" National Institute for Material Science, pp. 1-2.
"First white LED using quantum dots created" © Sandia pp. 1-3, Jul. 15, 2003.
U.S. Appl. No. 10/832,464, Rains et al.
U.S. Appl. No. 10/601,101, May et al.
Inventions and Innovation Project Fact Sheet "Development of Phosphors for Use in High-Efficiency Lighting and Displays" Office of Industrial Technologies, Energy Efficiency and Renewable Energy, US Department of Energy, pp. 1-2.
"A Solid Future for Lighting" Science and Technology, Economist.com, pp. 1-4.
"Innovations push white LEDs toward new applications" CompoundSemiconductor.net pp. 1-3.
"Frequently Asked Questions about Solid-State Lighting" Sandia National Laboratories pp. 1-4.
Bhat, J., et al., "High Power White LED Technology for Solid State Lighting" © Lumileds Lighting LLC Company Confidential pp. 1-40.
Steigerwald, Daniel A., et al. "Illumination With Solid State Lighting Technology." IEEE Journal on Selected Topics in Quantum Electronics, vol. 8, No. 2, Mar./Apr. 2002, pp. 310-320.
Xiang, Hector. "efg's Chromaticity DIagrams Lab Report." URL: http://www.efg2.com/Lab/Graphics/Colors/Chromaticity.htm pp. 1-15.
Tawil, Joe., et al. "Colorimetry." URL: http://www.cameragulld.com/technology/colrimetry.htm pp. 1-13.
Holographic Diffusers, EO Edmund Industrial Optics, available at http://edmundoptics.com/onlinecatalog/DisplayProduct.dfm?productid=1363.
"Source Four Revolution", 2003.
"Developmental Product Technical Data Bulletin" Ferro Corporation-Specialty Plastics Group, Filled and Reinforced Plastics Division, Evansville, IN, Jan. 2002.
"Industrial Equipment News . . . The Leading Publisher of New Products Worldwide" IEN, Apr. 2003, www.inquiryexpress.com.
"Holographic Diffusers", EO Edmund Industrial Optics, available at http://www.edmundoptics.com/onlinecatalog/DisplayProduct.cfm?productid-1363.
"Source Four Revolution", 2003.

"LSI Unveils the LumeLEX™ at ARC06", Product News, Lighting Services Inc., URL: http//www.lightingservicesinc.com/press_article.asp?pressID=103, printed Feb. 16, 2006.

"TIR Systems Partner Lighting Services Inc. Unveils First Product Based on Lexel™ Technology at ARC06 In London", Press Release, Feb. 13, 2006.

"Bridging the Gap for LEDs in the Architectural and Lighting Markets" Brent York, TIR Systems Ltd., Blue 2005, May 16-19.

"Commercializing Innovative SSL Technology: From the Laboratory to Lighting", Leonard Hordyk, TIR Systems Limited, Strategies in Light, Feb. 16, 2006.

LightFair International 2005, "Workshop 4: LED Technology—Bridging the Gap: From LEDs to Lighting", Grant Harlow, TIR Systems Ltd., Apr. 11, 2005.

* cited by examiner

OPTICAL SYSTEM USING LED COUPLED WITH PHOSPHOR-DOPED REFLECTIVE MATERIALS

TECHNICAL FIELD

The present subject matter relates to techniques and equipment to process radiant energy from light emitting diodes or the like using external phosphor-doped reflectors, typically so as to produce substantially white light of desired characteristics.

BACKGROUND

The future of high-efficiency lighting rests in the use of light emitting diodes (LEDs) or other semiconductor devices, specifically those used to emit white light. The actual semiconductor elements, however, produce light of specific limited spectral characteristics. There are several techniques for creating white light using LEDs or the like. The most efficient technique involves combining individual light from LEDs of different wavelength (color) outputs, for example from Red, Green and Blue LEDs, in a diffusely reflective cavity. A variety of such techniques and structures using optical integrating cavities are described in commonly assigned copending U.S. application Ser. No. 10/832,464 (filed on Apr. 27, 2004) and Ser. No. 10/601,101 (filed on Jun. 23, 2003), the disclosures of which are incorporated herein entirely by reference.

Phosphor doping techniques for generating white light from LEDs, currently favored by LED manufacturers, include Blue LED pumped with phosphors and Quantum dots pumped with UV LEDs. The macro integration by a diffusely reflective cavity, as in the above-cited applications is more efficient, however, the color rendering index (CRI) of the white light output is typically less desirable than that provided by phosphor-doped LEDs.

Although there are a variety of structures and techniques to fabricate phosphor-doped LEDs, such devices typically operate in one of two ways, as summarized below. In a UV LED pumped with RGB phosphors, non-visible UV light excites the mixture of red-green-blue phosphors doped at some point within the LED package to emit light across the visible spectrum. There is no direct contribution of visible light from the UV LED semiconductor chip within the package. In the other typical approach, a Blue LED is pumped with one or more phosphors doped at a point within the package. Some of the blue light from a blue LED chip (460 nm) excites the phosphor to emit yellow light and then the rest of the blue light is mixed with the yellow to make white light. Additional phosphors can be used to improve the spectral characteristics. In either case, the phosphor doping has been integrated directly into the LED and/or its package, for example by doping a portion of the package or by coating the portion of the package through which the light emerges. Dopants have also been used on reflectors or transmissive layers inside of the package containing the actual LED chip.

However, there are limits to the amount of phosphors that can be integrated into the LED die by such techniques. As a result, the performance of the phosphors degrades over a period of time much shorter than the operational life of the semiconductor LED chip. Epoxy degradation can affect the efficiency of the light created. In addition, there are thermal and sizing issues that must be considered.

Hence a need exists for more effective techniques to use light emitting diodes (LEDs) or other semiconductor devices to produce white light of high quality (e.g. desirable color rendering index) without significant reliance on phosphor doping within the LED die package.

SUMMARY

To address such needs entails a shift in the phosphor doping paradigm, by removing the phosphors from the LED device and integrating the phosphor into the reflective materials used by external structures.

For example, a lighting system, for emitting visible light so as to be perceptible by a person, utilizes an energy source package, for emitting radiant energy of a first wavelength. A reflector is located outside the energy source package. The reflector has a reflective surface arranged to receive radiant energy from the energy source package. The system includes at least one phosphor doped within the external reflector. Radiant energy of the first wavelength from the energy source package excites the phosphor to emit visible light. The emitted light comprises visible light energy of at least one second wavelength different from the first wavelength. At least some of visible light emitted by the phosphor is reflected by the reflective surface of the reflector. The lighting system directs at least the visible light from the phosphor so that it can be perceived by the person.

Examples of the system use a semiconductor device and an enclosure as the energy source package, although other examples utilize a plurality or an array of such packages for emitting the radiant energy of the first wavelength. Typically, the semiconductor is a light emitting diode (LED), although other light emitting semiconductors may be used. In some configurations, the LED emits at least some ultraviolet (UV) radiation. In other configurations, the LED emits blue light. Various combinations of UV, white or blue LEDs with red and green LEDs also are disclosed.

The disclosed examples of the system typically utilize a reflective surface that exhibits a diffuse reflective characteristic. In several examples, the reflective surface forms an optical integrating cavity with an aperture for emission of combined radiant energy. A deflector having an inner reflective surface coupled to the aperture of the optical integrating cavity may be used to direct the light emissions to a desired field of illumination.

Examples are also disclosed that utilize principles of constructive occlusion. In a constructive occlusion implementation of the system, the reflective surface forms a diffusely reflective cavity having an aperture. The lighting system further includes a mask, outside the cavity. The mask has a reflective surface facing toward the aperture of the cavity and is arranged to occlude a substantial portion of the aperture. As discussed in the detailed description, selection of the position of the mask and sizing of the mask, relative to the cavity aperture, allows the designer to tailor the visible light output distribution of the constructive occlusion type system to a desired illumination or luminance application.

In another example, the lighting uses a second reflector, positioned between the energy source package and a region to be illuminated by the visible light from the system, so as to mask view of the energy source package by the person. A phosphor doped within the second reflector also emits visible light, comprising visible light energy of a wavelength different from the first wavelength, to supplement the light emissions form the phosphor in the first reflector.

Systems are also disclosed that utilize two or more phosphors. The different types of phosphors may be excited by energy of the same wavelength e.g. from the same or similar sources. Alternatively, the phosphors may be excited by energy of different wavelengths, e.g. UV and Blue from two different types of LEDs. In two phosphor examples, a first phosphor is excited by radiant energy of the first wavelength to emit visible light comprising light energy of the second wavelength. The second phosphor is of a type different from the first type, so that excitation of the second phosphor causes that dopant to emit visible light comprising light energy of a third wavelength different from the first and second wavelengths. A three phosphor implementation would include a third phosphor of yet another type. Excitation of the third phosphor causes it to emit visible light comprising light energy of a fourth wavelength different from the first, second and third wavelengths.

As noted, examples are disclosed that rely on optical cavity integration to combine multiple light wavelengths. Thus a lighting system, for emitting visible light might comprise a structure forming an optical integrating cavity with a material forming a diffusely reflective inner surface of the cavity and at least one passage for emission of radiant energy integrated by diffuse reflection within the cavity. A light emitting semiconductor device is coupled to emit radiant energy of a first wavelength into the cavity. A system of this type includes at least one phosphor doped into the material forming the diffusely reflective inner surface of the cavity. The phosphor is one that when excited by radiant energy of the first wavelength emits visible light of at least one second wavelength different from the first wavelength for reflection and integration within the cavity so as to be included in light emitted through the passage.

The disclosed concepts also encompass a method of producing substantially white light for an application visible by a person. The method entails generating light of a first wavelength and impinging at least a portion of that light energy on a diffusely reflective surface of a doped material. A first phosphor within the doped material is excited by a portion of the light energy impinging on the diffusely reflective surface, so as to emit visible light of a second wavelength different from the first wavelength. The method also involves exciting a second phosphor within the doped material so that the excited second phosphor emits visible light of a third wavelength different from the first and second wavelengths. Diffuse reflection of at least some of the light of the first wavelength from the diffusely reflective surface serves to combine light of the first wavelength with the light of the second and third wavelengths, to form the substantially white light. The resulting substantially white light is emitted or directed toward a region intended to be illuminated for the application visible by the person.

Additional objects, advantages and novel features of the examples will be set forth in part in the description which follows, and in part will become apparent to those skilled in the art upon examination of the following and the accompanying drawings or may be learned by production or operation of the examples. The objects and advantages of the present subject matter may be realized and attained by practice or use of the methodologies, instrumentalities and combinations particularly pointed out in the appended claims.

BRIEF DESCRIPTION OF THE DRAWINGS

The drawing figures depict one or more implementations in accord with the present concepts, by way of example only, not by way of limitations. In the figures, like reference numerals refer to the same or similar elements.

FIG. 4a illustrates an example of a white light emitting system in partial cross-section, wherein the system utilizes an optical integrating cavity, a plurality of LED type sources and a deflector to process the output light.

FIG. 4b is an interior view of the LEDs and aperture of the system of FIG. 4a.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and circuitry have been described at a relatively high-level, without detail, in order to avoid unnecessarily obscuring aspects of the present concepts.

The various fixtures, systems and lighting techniques disclosed herein relate to applications of visible light for illumination or luminance for use/perception by humans. For example, a fixture may provide illumination of a room, space or area used or inhabited by a person. For a task lighting example, a fixture or system would provide light in the area, particularly on a work surface such as a desk or the like where the person performs the task. Other examples provide lighting in spaces such as walkways or stairs used by the person, or illuminate specific objects viewed by the person such as product displays or art works or the like. In addition to illumination applications, the lighting technologies discussed herein find wide use in luminance applications, such as indicator lights or signage lights observable by persons.

Figure 1:
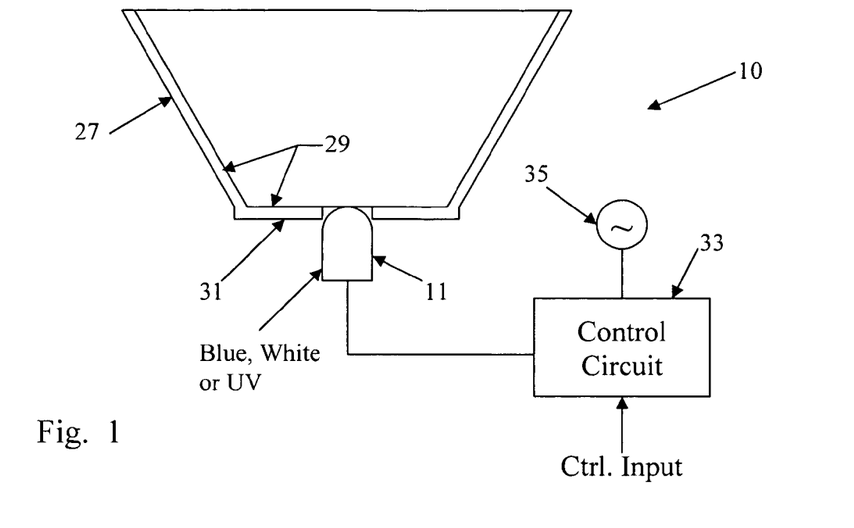
FIG. 1 illustrates an example of a white light emitting system, with certain elements thereof shown in cross-section.

Reference now is made in detail to the examples illustrated in the accompanying drawings and discussed below. FIG. 1 is a simplified illustration of a lighting system 10, for emitting visible light so as to be perceptible by a person. A portion of the system is shown in cross-section, and circuit elements are shown in functional block form. The system 10 utilizes an energy source package 11, for emitting radiant energy of a first wavelength. In a simple example of the type shown, the source 11 typically emits blue or white visible light or emits ultraviolet radiation.

The radiant energy source package 11 typically is a semiconductor based structure for emitting the radiant energy. The structure includes a semiconductor chip, such as a light emitting diode (LED), a laser diode or the like, within an enclosure. A glass or plastic portion of the enclosure allows for emission of the light or other energy from the chip in the desired direction. Many such source packages include internal reflectors to direct energy in the desired direction and reduce internal losses. To provide readers a full understanding, it may help to consider an example.

Figure 2:
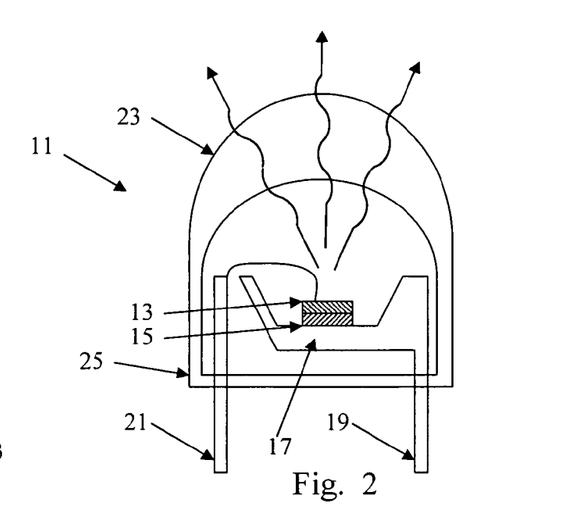
FIG. 2 is a simplified cross-sectional view of a light-emitting diode (LED) type source package, which may be used as the source in the system of FIG. 1.

FIG. 2 illustrates an example of an LED type source package 11, in cross section. In the example of FIG. 2, the source 11 includes a semiconductor chip, comprising two or more semiconductor layers 13, 15 forming an LED. The semiconductor layers 13, 15 are mounted on an internal reflective cup 17, formed as an extension of a first electrode, e.g. the cathode 19. The cathode 19 and anode 21 provide electrical connections to layers of the semiconductor device within the package. An epoxy dome 23 (or similar transmissive part) of the enclosure 25 allows for emission of the light or other energy from the chip in the desired direction. Internal reflectors, such as the reflective cup 17, direct energy in the desired direction and reduce internal losses. Although one or more elements in the package, such as the reflector 17 or dome 23 maybe doped or coated with doped materials, phosphor doping integrated in (on or within) the package is not required.

Returning to FIG. 1, the system 10 utilizes a reflector 27, located outside the energy source package 11. The reflector 27 has a reflective surface 29 arranged to receive at least some radiant energy from the energy source package 11. In the example, the emitting region of the source 11 fits into or extends through an aperture in a back section 31 of the reflector 27. The source 11 may be coupled to the reflector 27 in any manner that is convenient and/or facilitates a particular illumination or luminance application of the system 10. For example, the source 11 may be within the volume of the reflector 27, the source may be outside of the reflector (e.g. above the reflector in the illustrated orientation) and facing to emit light into the interior of the reflector, or the light may be coupled from the source 11 to the reflector 27 via a light guide or pipe or by an optical fiber.

The apparatus 10 also includes a control circuit 33 coupled to the LED chip in the package 11 for establishing output intensity of radiant energy of the LED type energy source package 11. The control circuit 33 typically includes a power supply circuit coupled to a voltage/current source, shown as an AC power source 35. Of course, batteries or other types of power sources may be used, and the control circuit 33 will provide the conversion of the source power to the voltage/current appropriate to the particular one or more LEDs 11 utilized in the system 10. The control circuit 33 includes one or more LED driver circuits for controlling the power applied to one or more LED packages 11 and thus the intensity of radiant energy output. The control circuit 21 may be responsive to a number of different control input signals, for example to one or more user inputs as shown by the arrow in FIG. 1, to turn power ON/OFF and/or to set a desired intensity level for the light provided by the system 10.

The disclosed apparatus may use a variety of different structures or arrangements for the reflector 27. Although other reflectivities may be used, in the example, at least a substantial portion of the interior surface(s) 29 of the reflector 27 exhibit(s) a diffuse reflectivity. It is desirable that the reflective surface 29 have a highly efficient reflective characteristic, e.g. a reflectivity equal to or greater than 90%, with respect to the relevant visible wavelengths. In the example of FIG. 1, the surface 29 is highly diffusely reflective to energy in the visible, near-infrared, and ultraviolet wavelengths.

The reflector 27 and reflective surface 29 may be formed of a diffusely reflective plastic material, such as a polypropylene having a 97% reflectivity and a diffuse reflective characteristic. Such a highly reflective polypropylene, referred to as HRP-97, is available from Ferro Corporation—Specialty Plastics Group, Filled and Reinforced Plastics Division, in Evansville, Ind. Another example of a material with a suitable reflectivity is SPECTRALON. Alternatively, the optical integrating cavity may comprise a rigid substrate (not separately shown) having an interior surface, and a diffusely reflective coating layer formed on the interior surface of the substrate so as to provide the diffusely reflective interior surface of the optical integrating cavity. The coating layer, for example, might take the form of a flat-white paint or white powder coat. A suitable paint might include a zinc-oxide based pigment, consisting essentially of an uncalcined zinc oxide and preferably containing a small amount of a dispersing agent. The pigment is mixed with an alkali metal silicate vehicle-binder which preferably is a potassium silicate, to form the coating material. For more information regarding the exemplary paint, attention is directed to U.S. Pat. No. 6,700,112 by Matthew Brown which issued on Mar. 2, 2004.

The material forming the reflective surface 29 of the reflector 27 is doped with at least one phosphor. A phosphor is any of a number of substances that exhibit luminescence when struck by radiant energy of certain wavelength(s). To provide desired color outputs, for example, it is increasingly common for the source packages to include phosphors at various locations to convert some of the chip output energy to more desirable wavelengths in the visible light spectrum. In the examples discussed herein, luminescent dopant(s), in the form of one or more phosphors, are doped into the reflector 27. In the examples, however, the reflector 27 is a macro device outside of or external to the package of the energy source 11, e.g. outside the enclosure 25 of the LED package 11 used to generate the radiant energy in the examples of FIGS. 1 and 2. There need be no phosphors within the LED source package 11. Of note here, the phosphors are integrated into the reflective materials used to form the reflective surface 29, that is to say on the external reflector 27.

At least some radiant energy of the first wavelength, emitted from the energy source package 11, impacts on the reflective surface 29 and excites the phosphor dopant within the material forming that surface to emit visible light. The emitted light comprises visible light energy of at least one second wavelength different from the first wavelength. At least some of visible light emitted by the phosphor is reflected by the reflective surface 29 of the reflector 27. The lighting system 10 directs at least the visible light from the phosphor so that it can be perceived by the person.

As outlined above, phosphors absorb excitation energy then re-emit the energy as radiation of a different wavelength than the initial excitation energy. For example, some phosphors produce a down-conversion referred to as a "Stokes shift," in which the emitted radiation has less quantum energy and thus a longer wavelength. Other phosphors produce an up-conversion or "Anti-Stokes shift," in which the emitted radiation has greater quantum energy and thus a shorter wavelength. Such energy shifts can be used to produce increased amounts of light in desirable portions of the spectrum. For example, by converting UV light to visible light, the shift increases system efficiency for visible illumination of luminance applications. The shift provided by the phosphors may also help to enhance the white light characteristics of the visible output, e.g. by conversion of some blue light emitted by a Blue or White LED.

In one system incorporating one or more blue LEDs (center frequency of 460 nm) as the source 11, the phosphors in the external reflector 27 may be from the green-yellow $Ce^{3+}$ doped garnet family (e.g. $(Y, Gd)_3AL_5O_{12}$). An alternative approach that results in even better color generation and white light of any color temperature adds green and red phosphors (e.g., $SrGa_2S_4$:$Eu^{2+}$ and $SrS$:$Eu^{2+}$). As light from the blue LEDs is mixed in the optical system formed by the reflector 27, the phosphors are excited and emit light over a broad spectrum that when added in the optical chamber or space formed by the external reflector 27 allows for the creation of extremely high quality (e.g., desirable CRI and color temperature) white light.

If one or more UV LEDs are used as the source 11, a blue phosphor (e.g., $Sr_2P_2O_7$), is added to the reflective material in addition to the green and red phosphors. Excitation of the various phosphors by the UV energy from the LED(s) produces blue, red and green light over a broad spectrum. The phosphor emissions are combined in the optical system formed by the reflector 27 to produce extremely high quality (e.g., desirable CRI and color temperature) white light.

In the system 10 of FIG. 1, with a single LED source package 11, the phosphor or phosphors in the external reflector 27 would be excited by the single wavelength of energy provided by that source. Where the system includes sources of multiple types, e.g. one or more UV LEDs in combination with one or more Blue or White LEDs, phosphors may be selected of different types excitable by the different wavelengths of the input energy from the sources.

There are many available phosphor options, primarily based on oxidic or sulfidic host lattices. Additional host materials are becoming available, e.g., those based on a solid solution of silicon nitride $(Mx(Si,Al)_{12}(N,O)_{16}$, where M is a solid solution metal such as Eu (or other optically active rare earth ions). Future phosphor formulations include nanophosphors based upon quantum dots, currently under development by DOE's Sandia National Laboratory.

The present approach, with doping of the external reflector, enables the system 10 to utilize much more phosphor material than could be provided within the relatively small LED type source package 11. As a result, the phosphor emissions do not degrade from usage as rapidly. Also, it is possible to provide adequate amounts of phosphors of a wider variety. Since the reflector 27 is not formed of an epoxy to encase the LED circuit chip, there is no epoxy degradation, which can decrease efficiency of the light created when doping is used within an LED package. In addition, the reflector 27 is not subject to the same magnitude of thermal effects as are found within the LED package 11 itself.

The present approach, with doping of the external reflector 27, also enables a combination of approaches to be used where we combine Red, Green, and Blue LEDs with UV LEDs into the optical chamber. Thus we use the visible output of the RGB LEDs, augmented by the additional light generated by Blue and/or UV LED-pumped phosphors.

In the illustrated orientation, energy from the source 11, phosphor emission, and any source energy or phosphor emissions reflected by the surface 29 are directed upwards, for example, for upward luminance or for lighting a ceiling so as to indirectly illuminate a room or other space below the fixture. The orientation shown, however, is purely illustrative. The source 11 and reflector 27 may be oriented in any other direction appropriate for the desired lighting application, including downward, any sideways direction, various intermediate angles, etc. In any such orientation, the visible light directed outward by the system 10 is combined, when perceived by a person, so that it appears as substantially white light. Also, the example of FIG. 1 utilizes relatively flat reflective surfaces. Those skilled in the art will recognize that the principles of that example are applicable to systems of other shapes and configurations, including systems that use various curved reflective surfaces (e.g. hemispherical, semi-cylindrical, parabolic, etc.).

Figure 3:
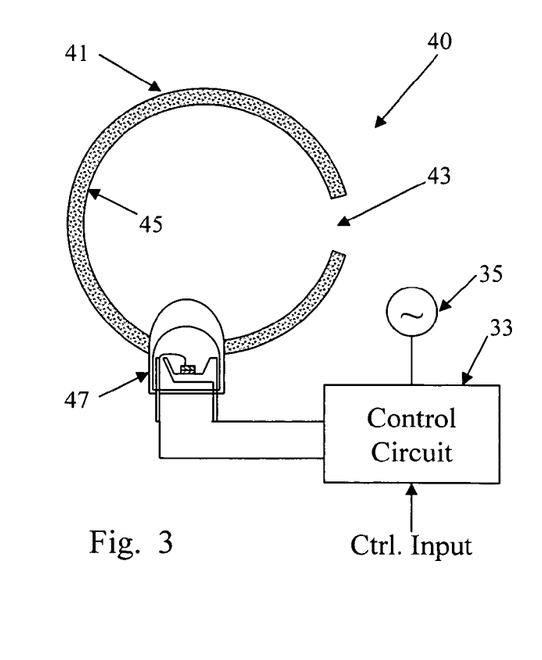
FIG. 3 illustrates an example of a white light emitting system, which utilizes an optical integrating cavity, with certain elements thereof shown in cross-section.

FIG. 3 illustrates another example of a radiant energy distribution apparatus or system. In several examples, the reflective surface forms an optical integrating cavity with an aperture for emission of combined radiant energy. FIG. 3 illustrates a first simple system 40 of this type. The element(s) forming the cavity are shown here in cross section.

The system 40 is generally similar to the system 10. For example, the system 40 may utilize essentially the same type of control circuit 35 and power source 35, as in the earlier example. The energy source 47 is substantially similar to the source 11 in the earlier example, and the reflector may utilize similar materials. However, the shape of the reflector is different, in that the reflector in the example of FIG. 3 forms an optical integrating cavity. Such a cavity provides an improved optical combination of the various colors of light, to enhance the 'white' light character of the system output.

A variety of cavity shapes may be used, virtually any shape will do so long as the inner surface is diffusely reflective and the shape provides multiple diffuse reflections of a substantial portion of the visible light. For discussion of this first simple example, it is convenient to assume that the reflector 41 is substantially spherical and has at least one aperture 43 for emission of integrated radiant energy.

The reflector 41 has a diffusely reflective inner surface 45, and the material forming that surface is doped with one or more phosphors. The reflective inner surface 45 forms an integrating cavity, with respect to radiant energy of the relevant wavelengths. The reflector material and the dopants may be substantially similar to those discussed above relative to the example of FIG. 1. The system 40 also includes an LED type light source package 47, similar to the source 11 and coupled to the cavity in a manner as described above relative to the coupling of the source 11 to the reflective surface 29 of the reflector 27.

The source 47 emits energy for multiple diffuse reflections by the surface 45 forming the cavity. With each reflection, a portion of the energy impacting the surface 45 excites one or more phosphors doped within the material of the reflector 41. Excited phosphor(s) emit visible light within the cavity, and that visible light also is diffusely reflected within the cavity. Although some beams may emerge directly through the aperture 43, most beams reflect one, two or more times before escaping through the passage 43.

The cavity defined by the reflective surface 45 effectively combines or 'integrates' the energy of the different wavelengths, so that the radiant energy emitted through the aperture 43 includes the radiant energy of the various wavelengths. Of note for purposes of visible light applications, the combined light includes visible light (if any) emitted from the source 47 and diffusely reflected from the surface 45, some visible light emitted by the phosphor dopants within the material forming the surface 45 and emerging directly through the aperture 43, as well as visible light emitted by the phosphor dopant(s) that is diffusely reflected by other parts of the surface 45 before emerging through the aperture 43. The wavelengths produced by the dopant emissions differ from and supplement the wavelengths emitted by the source 47. By combining these various wavelengths, it is possible to combine visible light colors to produce a desired quality (e.g. desirable color render index or "CRI") of white light emissions of the system 40 through the aperture 43.

In the example, the apparatus 40 is shown with the cavity and aperture 43 oriented to emit the combined radiant energy sideways, to the right, through the aperture, for convenience of illustration and discussion. However, the fixture portion of the apparatus 40 may be oriented in any desired direction to perform a desired application function, for example to provide visible luminance to persons in a particular direction or location with respect to the fixture or to illuminate a different surface such as a wall, floor or table top. Also, the optical integrating cavity formed by the inner surface 45 may have more than one aperture 43, for example, oriented to allow emission of integrated light in two or more different directions or regions.

The system 40 may include additional optical processing elements, for processing of the white light emissions from the cavity aperture 43. Examples include deflectors of various shapes and reflective characteristics, lenses, masks, collimators, focusing systems, irises, diffusers, holographic diffusers and the like located in, over or otherwise coupled to the aperture(s) 43. To help fully understand, it may be useful to consider a first example, using a deflector having an inner reflective surface coupled to the aperture of the optical integrating cavity, to direct the light emissions from the aperture to a desired field of illumination. Such an example appears in FIGS. 4*a* and 4*b*.

Figures 4A, 4B:
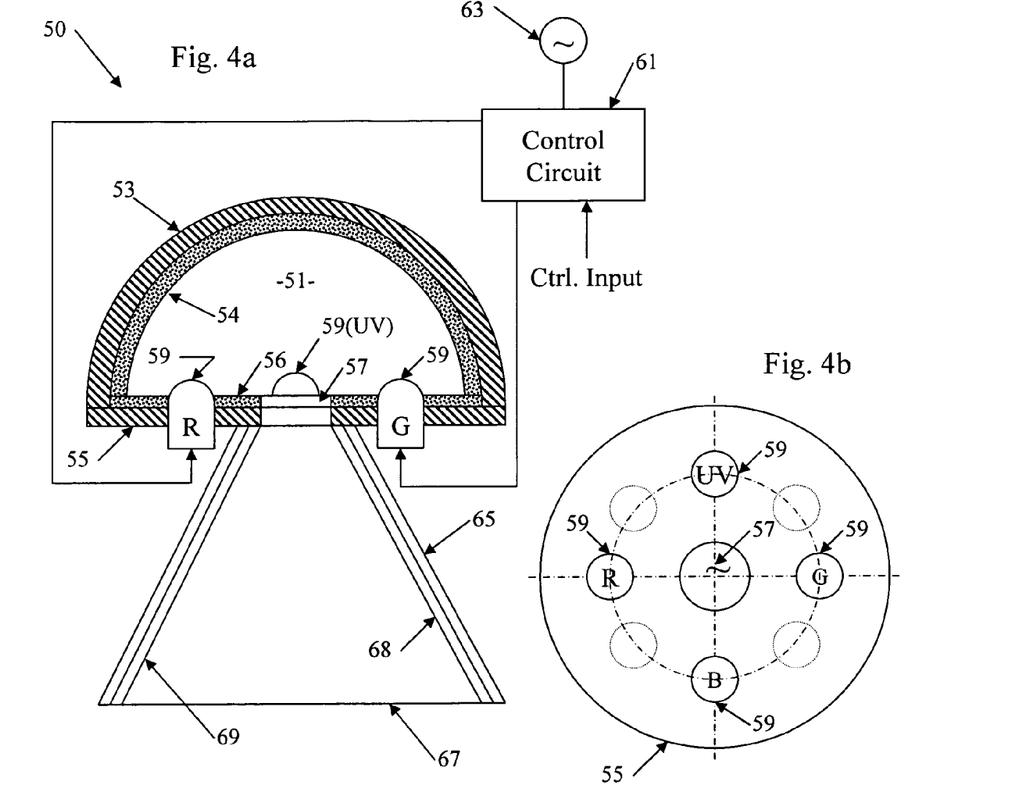

FIG. 4*a* is a cross-sectional illustration of a radiant energy distribution apparatus or system 50. For task lighting applications, the system 50 emits light in the visible spectrum, although the system 50 may be used for illumination or luminance applications. The illustrated system 50 includes an optical cavity 51 having a diffusely reflective interior surface to receive and combine radiant energy of different reflective colors/wavelengths. The cavity 51 may have various shapes. The illustrated cross-section would be substantially the same if the cavity is hemispherical or if the cavity is semi-cylindrical with the cross-section taken perpendicular to the longitudinal axis. The optical cavity 51 in the example discussed below is typically an optical integrating cavity, and although the shape is different, the cavity 51 functions in a manner similar to the cavity in the example of FIG. 3.

At least a substantial portion of the interior surface(s) of the cavity 51 exhibit(s) diffuse reflectivity. It is desirable that the cavity surface have a highly efficient reflective characteristic, e.g. a reflectivity equal to or greater than 90%, with respect to the relevant wavelengths. In the example of FIGS. 4*a* and 4*b*, the surface is highly diffusely reflective to energy in the visible, near-infrared, and ultraviolet wavelengths.

For purposes of the discussion, the cavity 51 in the apparatus 50 is assumed to be hemispherical. In the example, a hemispherical dome 53 and a substantially flat cover plate 55 form the optical cavity 51. Although shown as separate elements, the dome and plate may be formed as an integral unit. At least the interior facing surface 54 of the dome 53 and the interior facing surface 56 of the cover plate 55 are highly diffusely reflective, so that the resulting cavity 51 is highly diffusely reflective with respect to the radiant energy spectrum produced by the system 50. As a result the cavity 51 is an integrating type optical cavity. The materials forming the inner surfaces 54, 56, shown as separate layers for discussion purposes, are doped with one or more phosphors, so that the impact of some of the energy on the surfaces causes emission of visible light of additional desired color(s).

As in the earlier examples, elements of the reflector forming the cavity 51 (e.g. consisting of dome 53 and plate 55) may be formed of a diffusely reflective plastic material, such as a polypropylene having a 97% reflectivity and a diffuse reflective characteristic. Such a highly reflective polypropylene, referred to as HRP-97, is available from Ferro Corporation—Specialty Plastics Group, Filled and Reinforced Plastics Division, in Evansville, Ind. Another example of a material with a suitable reflectivity is SPECTRALON. Alternatively, one or more of the elements forming the optical integrating cavity 51 may comprise a rigid substrate having an interior surface, and a diffusely reflective coating layer formed on the interior surface of the substrate so as to provide the diffusely reflective interior surface 54 or 56 of the optical integrating cavity 51. The coating layer, for example, might take the form of a flat-white paint or white powder coat. A suitable paint might include a zinc-oxide based pigment, consisting essentially of an uncalcined zinc oxide and preferably containing a small amount of a dispersing agent. The pigment is mixed with an alkali metal silicate vehicle-binder which preferably is a potassium silicate, to form the coating material. For more information regarding the exemplary paint, attention is directed to U.S. Pat. No. 6,700,112 by Matthew Brown which issued on Mar. 2, 2004.

The materials forming the reflective surface 54, 56 are doped with at least one phosphor. As a result the structure appears layered in cross-section, either due to coating a substrate with the doped reflective material or due to doping with the phosphors to a desired depth within the diffusely reflective plastic material. The specific phosphor dopant(s) used will be similar to those discussed above, and one or more phosphors are selected to convert portions of the energy from the sources 59 to the desired spectrum for color combination and output as white light.

The optical integrating cavity 51 has an aperture 57 for allowing emission of combined radiant energy. In the example, the aperture 57 is a passage through the approximate center of the cover plate 55, although the aperture may be at any other convenient location on the plate 55 or the dome 53. As noted in the discussion of FIG. 3, there may be a plurality of apertures, for example, oriented to allow emission of integrated light in two or more different directions or regions.

Because of the diffuse reflectivity within the cavity 51, light within the cavity is integrated before passage out of the aperture 57. In the examples, the apparatus 50 is shown emitting the combined radiant energy downward through the aperture, for convenience. However, the apparatus 50 may be oriented in any desired direction to perform a desired application function, for example to provide visible luminance to persons in a particular direction or location with respect to the fixture or to illuminate a different surface such as a wall, floor or table top.

The apparatus 50 also includes a plurality of sources of radiant energy. As will be discussed below, the sources may provide a single color or wavelength of energy, e.g. UV energy, or the sources may provide energy of different wavelengths. Although other semiconductor devices may be used, in this example, the sources are LEDs 59, three of which are visible in the illustrated cross-section. The LEDs are generally similar to the LED package 11 of FIG. 2. The LEDs 59 supply radiant energy into the interior of the optical integrating cavity 51. As shown, the points of emission into the interior of the optical integrating cavity are not directly visible through the aperture 57.

The system 50 of FIGS. 4a and 4b may utilize various combinations of LEDs producing UV or various combinations of visible light, for integration in the cavity 51. For purposes of discussion, the system 50 combines Red, Green, and Blue LEDs with one or more UV LEDs coupled to emit energy into the optical chamber 51. As shown in the interior view of FIG. 4b, there are four LED packages 59, one Red (R), one Green (G), one Blue (B) and one Ultraviolet (UV) arranged substantially in a circle around the aperture 57 through the cover plate 55. Of course there may be additional LED packages coupled through openings in the plate, as represented by the dotted line circles. LEDs also may be provided at or coupled to other points on the plate or dome. The Red (R) and Green (G) LEDs are fully visible in the illustrated cross-section of 4a, and the dome of the UV LED package is visible as it extends into the cavity 51. Assuming four LEDs only for simplicity, the Blue LED is not visible in this cross-section view. It should be apparent, however, that the system 50 uses the visible output of the RGB LEDs, augmented by the additional light generated by UV LED-pumped phosphors.

In this example, light outputs of the LED sources 59 are coupled directly to openings at points on the interior of the cavity 51, to emit radiant energy directly into the interior of the optical integrating cavity 51. The LEDs 59 may be located to emit light at points on the interior wall of the element 53, although preferably such points would still be in regions out of the direct line of sight through the aperture 57. For ease of construction, however, the openings for the LEDs 59 are formed through the cover plate 55. On the plate 55, the openings/LEDs may be at any convenient locations. Of course, the LED packages or other sources may be coupled to the points for entry into the cavity 51 in any other manner that is convenient and/or facilitates a particular illumination or luminance application of the system 50. For example, one or more of the sources 59 may be within the volume of the cavity 51. As another example, the sources 59 may be coupled to the openings into the cavity 51 via a light guide or pipe or by an optical fiber.

The source LEDs 59 can include LEDs of any color or wavelength, although one or more LEDs are chosen specifically to emit energy that pumps the phosphor doping within the reflective surfaces 54, 56. The integrating or mixing capability of the cavity 51 serves to project white or substantially white light through the aperture 57. By adjusting the intensity of the various sources 59 coupled to the cavity, it becomes possible to precisely adjust the color temperature or color rendering index of the light output.

The system 50 works with the totality of light output from a family of LEDs 59 and light output from the phosphor dopants. However, to provide color adjustment or variability, it is not necessary to control the output of individual LEDs, except as they contribute to the totality. For example, it is not necessary to modulate the LED outputs. Also, the distribution pattern of the individual LEDs 59 and their emission points into the cavity 51 are not significant. The LEDs 59 can be arranged in any convenient or efficient manner to supply radiant energy within the cavity 51, although it is preferred that direct view of the LEDs from outside the fixture is minimized or avoided.

The apparatus 50 also includes a control circuit 61 coupled to the LEDs 59 for establishing output intensity of radiant energy of each of the LED sources. The control circuit 61 typically includes a power supply circuit coupled to a source, shown as an AC power source 63, although those skilled in the art will recognize that batteries or other power sources may be used. In its simplest form, the circuit 61 includes a common driver circuit to convert power from source 63 to the voltages/current appropriate to drive the LEDs 59 at an output intensity specified by a control input to the circuit 61. The control input may be indicate an ON/OFF state and/or provide a variable intensity control.

It is also contemplated that the LEDs may be separately controlled, to allow control of the color temperature or color rendering index of the white light output. In such an implementation, the control circuit 61 includes an appropriate number of LED driver circuits for controlling the power applied to each of the individual LEDs 59 (or to each of a number of groups of LEDs, where each group emits energy of the same wavelength). These driver circuits enable separate control of the intensity of radiant energy supplied to the cavity 51 for each different wavelength. Control of the intensity of emission of the sources sets a spectral characteristic of the radiant energy supplied into the cavity 51 and thus the components that drive the phosphor emissions and/or supply visible light for integration within the cavity and thus for emission through the aperture 57 of the optical integrating cavity. The control circuit 61 may be responsive to a number of different control input signals, for example, to one or more user inputs as shown by the arrow in FIG. 4a. Although not shown in this simple example, feedback may also be provided.

Those skilled in the art will be familiar with the types of control circuits that may be used, for example, to provide user controls and/or a variety of desirable automated control functions. A number of such circuits as well as various shapes and configurations of the cavity, the deflector and various alternative output processing elements are disclosed in commonly assigned copending U.S. application Ser. No. 10/832,464 (filed on Apr. 27, 2004); and the disclosures thereof from that application are incorporated herein entirely by reference.

The aperture 57 may serve as the system output, directing integrated color light to a desired area or region to be illuminated, in a manner similar to the example of FIG. 3. Although not shown in this example, the aperture 57 may have a grate, lens or diffuser (e.g. a holographic element) to help distribute the output light and/or to close the aperture against entry of moisture or debris. For some applications, the system 50 includes an additional deflector or other optical processing element, e.g. to distribute and/or limit the light output to a desired field of illumination.

In the example of FIG. 4a, the color integrating energy distribution apparatus also utilizes a conical deflector 65 having a reflective inner surface 69, to efficiently direct most of the light emerging from a light source into a relatively narrow field of view. A small opening at a proximal end of the deflector is coupled to the aperture 57 of the optical integrating cavity 51. The deflector 65 has a larger opening 67 at a distal end thereof. The angle and distal opening of the conical deflector 65 define an angular field of radiant energy emission from the apparatus 50. Although not shown, the large opening of the deflector may be covered with a transparent plate or lens, or covered with a grating, to prevent entry of dirt or debris through the cone into the system and/or to further process the output radiant energy.

The conical deflector 65 may have a variety of different shapes, depending on the particular lighting application. In the example, where cavity 51 is hemispherical, the cross-section of the conical deflector is typically circular. However, the deflector may be somewhat oval in shape. In applications using a semi-cylindrical cavity, the deflector may be elongated or even rectangular in cross-section. The shape of the aperture 57 also may vary, but will typically match the shape of the small end opening of the deflector 65. Hence, in the example the aperture 57 would be circular. However, for a device with a semi-cylindrical cavity and a deflector with a rectangular cross-section, the aperture may be rectangular.

The deflector 65 comprises a reflective interior surface 69 between the distal end and the proximal end. In some examples, at least a substantial portion of the reflective interior surface 69 of the conical deflector exhibits specular reflectivity with respect to the integrated radiant energy. As discussed in U.S. Pat. No. 6,007,625, for some applications, it may be desirable to construct the deflector 65 so that at least some portions of the inner surface 69 exhibit diffuse reflectivity or exhibit a different degree of specular reflectivity (e.g. quasi-specular), so as to tailor the performance of the deflector 65 to the particular application.

For other applications, it may also be desirable for the entire interior surface 69 of the deflector 65 to have a diffuse reflective characteristic. In such cases, the deflector 65 may be constructed using materials similar to those taught above for construction of the optical integrating cavity 51. Hence, in the example of FIG. 4a, the deflector has a surface layer 68 forming the diffusely forming the diffusely reflective inner surface 69. As in the cavity 51, this diffusely reflective surface layer is doped with one or more phosphors as represented diagrammatically by the layer 68. When exited by radiation from the aperture 57 of an appropriate wavelength, the phosphors emit visible light. The phosphors doped into the layer 68 are of the same types discussed above. It should be noted, however, that for some applications, it may be desirable to use one or more phosphors in the layer 68 that are different from those used to dope the layers 54, 56 within the cavity 51.

In the illustrated example, the large distal opening 67 of the deflector 65 is roughly the same size as the cavity 51. In some applications, this size relationship may be convenient for construction purposes. However, a direct relationship in size of the distal end of the deflector and the cavity is not required. The large end of the deflector may be larger or smaller than the cavity structure. As a practical matter, the size of the cavity 51 is optimized to provide the integration or combination of light colors from the desired number of LED sources 59 and the phosphor dopants generating light within the cavity 51. The size, angle and shape of the deflector 65 in turn determine the area that will be illuminated by the combined or integrated light emitted from the cavity 51 via the aperture 57.

An exemplary system 50 may also include a number of "sleeper" LEDs (for example at the dotted line positions shown in FIG. 4b) that would be activated only when needed, for example, to maintain the light output, color, color temperature. or thermal temperature. As noted above, a number of different examples of control circuits may be used. In one example, the control circuitry comprises a color sensor coupled to detect color distribution in the integrated radiant energy. Associated logic circuitry, responsive to the detected color distribution, controls the output intensity of the various LEDs, so as to provide a desired color distribution in the integrated radiant energy. In an example using sleeper LEDs, the logic circuitry is responsive to the detected color distribution to selectively activate the inactive light emitting diodes as needed, to maintain the desired color distribution in the integrated radiant energy. As LEDs age or experience increases in thermal temperature, they continue to operate, but at a reduced output level. The use of the sleeper LEDs greatly extends the lifecycle of the fixtures. Activating a sleeper (previously inactive) LED, for example, provides compensation for the decrease in output of an originally active LED. There is also more flexibility in the range of intensities that the fixtures may provide.

To provide a particular desirable output distribution from the apparatus, it is also possible to construct the system so as to utilize principles of constructive occlusion. Constructive Occlusion type transducer systems utilize an electrical/optical transducer optically coupled to an active area of the system, typically the aperture of a cavity or an effective aperture formed by a reflection of the cavity. Constructive occlusion type systems utilize diffusely reflective surfaces, such that the active area exhibits a substantially Lambertian characteristic. A mask occludes a portion of the active area of the system, in the examples, the aperture of the cavity or the effective aperture formed by the cavity reflection, in such a manner as to achieve a desired response or output characteristic for the system. In examples of the present apparatus using constructive occlusion, an optical integrating cavity might include a base, a mask and a cavity formed in the base or the mask. The mask would have a reflective surface. The mask is sized and positioned relative to the active area of the system so as to constructively occlude the active area. At least one of the reflective areas is doped with phosphors, to provide the desired white light generation from the energy supplied by the energy source package. To fully understand applications utilizing constructive occlusion, it may be helpful at this point to consider some representative examples.

Figure 5:
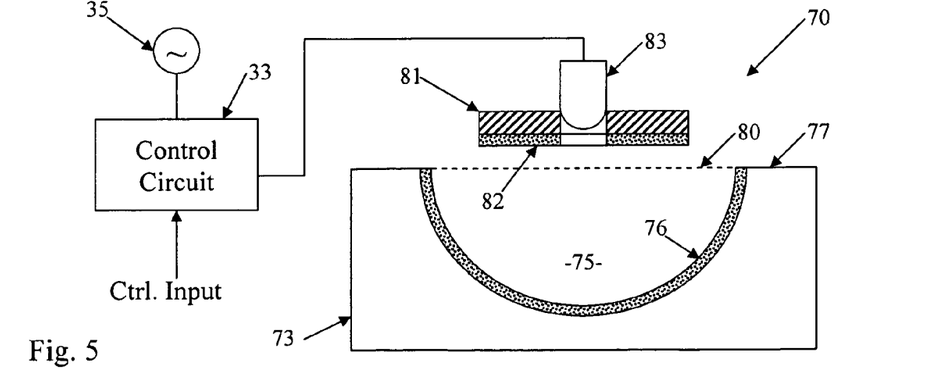
FIG. 5 illustrates an example of another white light emitting system, using principles of constructive occlusion, with certain elements thereof shown in cross-section.

FIG. 5 is a simplified diagram illustrating a constructive occlusion type implementation 70 of a lighting system, such as might be used for humanly perceptible illumination or luminance applications. The elements of the system 70 that form the optical integrating cavity appear in cross-section in this illustration. In the illustration, the system 70 is oriented to provide upward illumination. Such a system might be suspended from a ceiling or canopy or the like, to provide indirect lighting of a room or area below the fixture, that is to say, due to reflection of the white light emissions form the system 70 downward by the ceiling or canopy or the like. Those skilled in the art will recognize that the designer may choose to orient the system 70 in different directions, to adapt the system to other illumination or luminance applications.

The lighting system 70 includes a base 73, having or forming a cavity 75, and one or more adjacent shoulders 77, constructed in a manner similar to the elements forming reflectors and/or integrating cavities in the earlier examples. In particular, the interior surface 76 forming the cavity 75 is diffusely reflective. The material forming that surface is doped to some depth, represented by the illustrated layer, with one or more phosphors as discussed in relation to the earlier examples. The up-facing surface(s) of shoulder(s) 77 may be reflective, although they may be specular or diffusely reflective. The perimeter of the cavity 75 forms an aperture 80.

A mask 81 is disposed between the cavity aperture 80 and the field to be illuminated. At least the surface 82 facing toward the aperture 80 is reflective. Although it may have other types of refelectivity (e.g. specular or quasi-specular), in the example, the surface 82 is diffusely reflective, and the material forming that surface is doped to some depth represented by the illustrated layer with one or more phosphors of the type(s) discussed above. The mask and its reflective surface may be formed of materials similar to those used to form the base and cavity.

In many constructive occlusion embodiments, the cavity 75 comprises a substantial segment of a sphere. For example, the cavity may be substantially hemispherical, however, this shape is chosen for simplicity of modeling, discussion and illustration. The shape varies with application design and is not critical. A variety of other shapes may be used. In the illustrated hemispherical example, the aperture 80 is circular, and the shoulder 77 forms a partial ring or a complete ring around the circular aperture 80. Where the cavity has other shapes, the aperture and the shoulders will vary in shape to conform to the cavity.

For purposes of constructive occlusion, the base 73 may be considered to have an active optical area, preferably exhibiting a substantially Lambertian energy distribution. Where the cavity 75 is formed in the base, for example, the planar aperture 80 formed by the rim or perimeter of the cavity 75 forms the active surface with substantially Lambertian distribution of energy emerging through the aperture.

The mask 81 constructively occludes a portion of the optically active area of the base with respect to the field of intended illumination. In the example of FIG. 5, the optically active area is the aperture 80 of the cavity 75; therefore the mask 81 occludes a substantial portion of the aperture 80, including the portion of the aperture on and about the axis of the mask and cavity system. The surface 82 of the mask 81 facing towards the aperture 80 is reflective, and in this example, includes phosphor dopants.

The relative dimensions of the mask 81 and aperture 80, for example the relative widths (or diameters or radii in a circular system) as well as the distance of the mask 81 away from the aperture 80, control the constructive occlusion performance characteristics of the lighting system 70. Certain combinations of these parameters produce a relatively uniform emission intensity with respect to angles of emission, over a wide portion of the field of view about the system axis (vertically upward in FIG. 5), covered principally by the constructive occlusion. Other combinations of size and height result in a system performance that is uniform with respect to a wide planar surface perpendicular to the system axis at a fixed distance from the active area.

The shoulder 77 also is reflective and therefore deflects at least some light upward. The shoulder (and side surfaces of the mask) provide additional optical processing of combined light from the cavity 75. The angle of the shoulder and the reflectivity of the surface thereof facing toward the region to be illuminated by constructive occlusion also contribute to the intensity distribution over that region. In the illustrated example, the reflective shoulder is horizontal, although it may be angled somewhat downward or upward from the plane of the aperture for particular applications. Although not shown in this example, the reflective surface(s) of the shoulder may be doped with one or more phosphors.

With respect to the energy of different wavelengths, the interior space formed between the cavity 75 and the facing surface 80 of the mask 81 operates as an optical integrating cavity, in essentially the same manner as the integrating cavities in the previous embodiments.

The system 70 utilizes an energy source package 83, for emitting radiant energy of a first wavelength into the space between the mask and cavity. Although there may be multiple sources, as discussed above, for simplicity of illustration and discussion, the system 70 uses a single source 83. The energy source 83 is substantially similar to the source 11 in the example of FIG. 1. In a simple example of the type shown, the source 83 typically emits blue or white or ultraviolet radiation. The system 70 may utilize essentially the same type of control circuit 35 and power source 35, as in several of the earlier examples.

In the example, the LED 83 is coupled to emit light directly through an opening or passage formed in the mask 81. The positioning of the light entry point is not critical, and the LED may be located to emit light directly or indirectly (via a light pipe or fiber) at any convenient point on the mask or the base.

In operation, the LED 83 emits radiant energy of a first wavelength into the space or cavity formed between the reflective surfaces 76 and 82. The radiant energy from the LED source package 83 excites the phosphor(s) in one or both of those surfaces to emit visible light of at least one second wavelength different from the first wavelength. For example, if the LED emits UV radiation, the phosphor(s) effectively shift the UV energy to visible light energy. If the LED 81 emits blue light, the phosphors convert some of the blue light to other visible colors of light. In the integrating volume formed between the surface 76 of the cavity and the facing surface 80 of the mask, the visible light is diffusely reflected. For many of the light rays, they are diffused and reflected two or more times within the volume. The repeated diffuse reflections integrates the light wavelengths to form substantially white light. The lighting system 70 directs at least the visible light outward via the gap between the perimeter of the cavity 75 and the edge(s) of the mask 81, so that it can be perceived by the person. However, the positional and dimensional relationships between the mask and the cavity aperture provide the desired distribution of this output light, and if reflective, the shoulder 77 contributes additional portions of the light in desired parts of the illuminated region.

Figure 6:
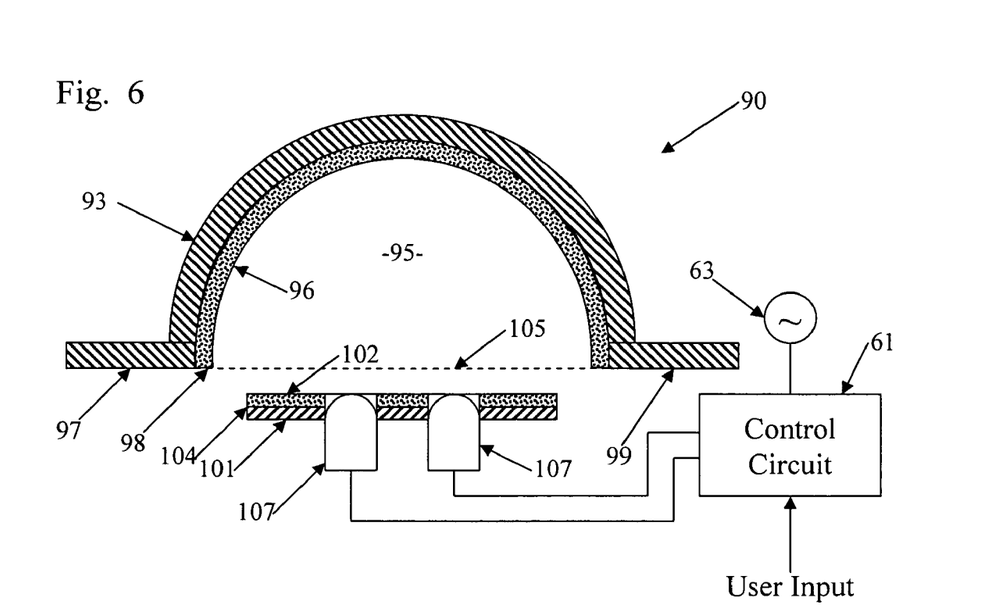
FIG. 6 illustrates another example of a radiant energy emitting system, utilizing principles of constructive occlusion.
Figure 7:
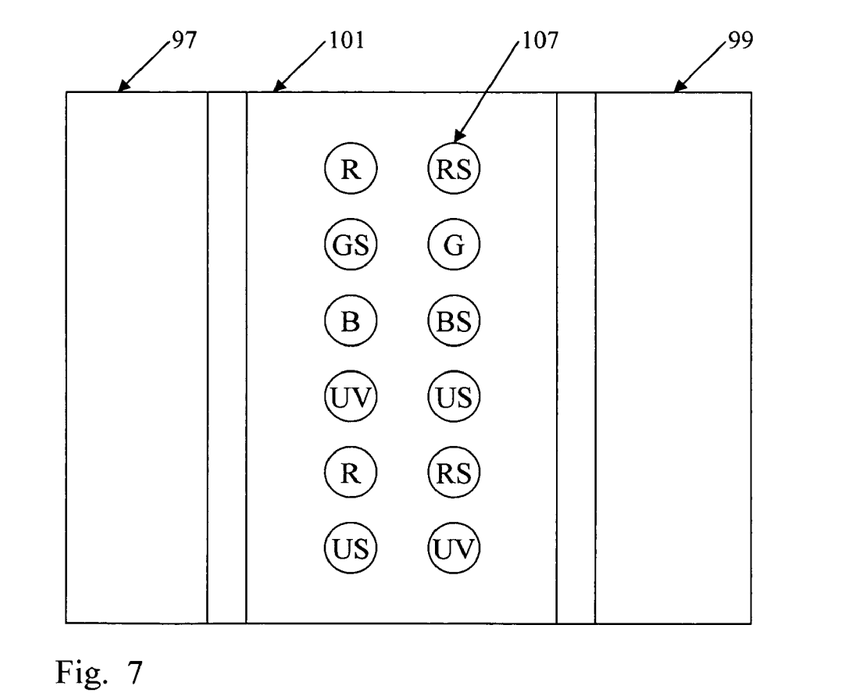
FIG. 7 is a bottom view of the fixture used in the system of FIG. 6.

FIGS. 6 and 7 depict another example of a light distributor apparatus or system 90, for projecting integrated multiwavelength light with tailored intensity distribution, using phosphor doping of the cavity surfaces. This example combines multiple LED source packages, including sleeper LEDs, with principles of constructive occlusion. In the cross-section illustration (FIG. 6), the system 90 is oriented to provide downward illumination. Such a system might be mounted in or suspended from a ceiling or canopy or the like. Those skilled in the art will recognize that the designer may choose to orient the system 90 in different directions, to adapt the system to other illumination applications or to luminance applications.

The lighting system 90 includes a base 93 having or forming a cavity 95 and adjacent shoulders 97 and 99, constructed in a manner similar to the elements forming integrating cavities in the earlier examples. In particular, the interior of the cavity 95 is diffusely reflective, and the down-facing surfaces of shoulders 97 and 99 may be reflective. Although the shoulder surfaces are reflective, they may be specular or diffusely reflective. A mask 101 is disposed between the cavity aperture 105 and the field to be illuminated. In this symmetrical embodiment, the interior wall of a half-cylindrical base 93 forms the cavity; therefore the aperture 105 is rectangular. The shoulders 97 formed along the sides of the aperture 105 are rectangular. If the base were circular, with a hemispherical cavity, the shoulders typically would form a ring that may partially or completely surround the aperture.

As noted, the interior of the cavity 95 is diffusely reflective and constructed in a manner similar to the integrating cavities in the earlier examples. For discussion purposes, assume in this example, that the base 93 is formed of a polypropylene having a 97% reflectivity and a diffuse reflective characteristic, such as HRP-97, from Ferro Corporation—Specialty Plastics Group, Filled and Reinforced Plastics Division, in Evansville, Ind. The plastic material is doped with phosphors, from the inner surface 96 of the cavity 95, to form a doped layer 98 as shown in the cross-sectional view (FIG. 6).

The phosphor(s) doped into the material of the base 93 to form the layer 98 may be any of one or more of the phosphors discussed in the earlier examples. As discussed more below, this example uses one or more UV sources, so at least one phosphor is of a type pumped by UV radiant energy, typically a blue phosphor such as $Sr_2P_2O_7$. The system also uses one or more Blue sources, so the dopants may include at least one phosphor of a type pumped by Blue radiant energy from the Blue LED(s) and/or from UV pumped phosphor emissions. The Blue pumped phosphors may be selected from the green-yellow $Ce^{3+}$ doped garnet family (e.g. $(Y, Gd)_3AL_5O_{12}$).

In many constructive occlusion systems, the cavity 95 comprises a substantial segment of a sphere. For example, the cavity may be substantially hemispherical, as in earlier examples. However, the cavity's shape is not of critical importance. A variety of other shapes may be used. In the illustrated example (FIGS. 6 and 7), the half-cylindrical cavity 95 has a rectangular aperture, and if extended longitudinally, the rectangular aperture may approach a nearly linear aperture (slit). Practically any cavity shape is effective, so long as it has a diffuse reflective inner surface and is doped with the appropriate phosphor materials. A hemisphere or the illustrated half-cylinder shape is preferred for the ease in modeling for the light output toward the field of intended illumination and the attendant ease of manufacture. Also, sharp corners tend to trap some reflected energy and reduce output efficiency.

For purposes of constructive occlusion, the base 93 may be considered to have an active optical area, preferably exhibiting a substantially Lambertian energy distribution. Where the cavity is formed in the base, for example, the planar aperture 105 formed by the rim or perimeter of the cavity 95 forms the active surface with substantially Lambertian distribution of energy emerging through the aperture. As noted above, the cavity may be formed in the facing surface of the mask. In such a system, the surface of the base may be a diffusely reflective surface, therefore the active area on the base would essentially be the mirror image of the cavity aperture on the base surface, that is to say the area reflecting energy emerging from the physical aperture of the cavity in the mask.

The mask 101 is disposed between the cavity aperture 105 and the field to be illuminated. At least the surface 102 facing toward the aperture 80 is reflective. Although it may have other types of reflectivity (e.g. specular or quasi-specular), in the example, the surface 102 is diffusely reflective, and the material forming that surface is doped to some depth represented by the illustrated layer 104 with one or more phosphors of the type(s) discussed above with regard to the layer 98. The mask 101 and its reflective surface 102 may be formed of materials similar to those used to form the base and cavity.

The mask 101 constructively occludes a portion of the optically active area of the base 93 with respect to the field of intended illumination. In the example of FIG. 6, the optically active area is the aperture 105 of the cavity 95; therefore the mask 101 occludes a substantial portion of the aperture 105 including the portion of the aperture on and about the axis of the mask and cavity system.

The relative dimensions of the mask 101 and aperture 105, for example the relative widths (or diameters or radii in a more circular system) as well as the distance of the mask away from the aperture 105 control the constructive occlusion performance characteristics of the visible lighting system 90. Certain combinations of these parameters produce a relatively uniform emission intensity with respect to angles of emission, over a wide portion of the field of view about the system axis (vertically downward in FIG. 6), covered principally by the constructive occlusion. Other combinations of size and height result in a system performance that is uniform with respect to a wide planar surface perpendicular to the system axis at a fixed distance from the active area, for example on a desktop, floor or wall illuminated by the system.

The shoulders 97, 99 also are reflective and therefore deflect at least some light downward. The shoulders (and side surfaces of the mask) provide additional optical processing of combined light emerging from the cavity 95 via the gaps between the edges of the mask 101 and the perimeter of the aperture 105. The angles of the shoulders and the reflectivity of the surfaces thereof facing toward the region to be illuminated by constructive occlusion also contribute to the intensity distribution over that region. In the illustrated example, the reflective shoulders are horizontal, although they may be angled somewhat downward from the plane of the aperture.

With respect to the energy of different wavelengths, the interior space formed between the surface 96 of the cavity 95 and the facing surface 102 of the mask 101 operates as an optical integrating cavity, in essentially the same manner as the integrating cavities in the previous examples. In this example, the LEDs provide UV radiant energy as well as visible light of a number of different colors. The phosphors responsive to the UV energy and the Blue light generate additional light (e.g. increased Blue light from UV pumping, and green-yellow light from Blue pumping). The optical cavity combines the visible light of multiple colors supplied from the visible light LEDs with that produced by the phosphor pumping. The constructive occlusion serves to distribute that combined light in a desired manner over a field or area that the system 90 is intended to illuminate, with a tailored intensity distribution.

The LEDs 107 could be located at (or coupled by optical fiber to emit light) from any location or part of the surface of the cavity 95. Preferably, the LED outputs are not directly visible through the un-occluded portions of the aperture 105 (between the mask and the edge of the cavity). In examples of the type shown in FIGS. 6 and 7, the easiest way to so position the LED outputs is to mount the LEDs 107 (or provide fibers or the like) so as to supply light to the chamber through openings through the mask 101.

FIG. 7 also provides an example of an arrangement of the LEDs in which there are both active and inactive (sleeper) LEDs of the various types. As shown, the active part of the array of LEDs 107 includes two Red LEDs (R), one Green LED (G) and one Blue LED (B). The active part of the array of LEDs 107 also includes two active UV LEDs. The initially inactive part of the array of LEDs 107 includes two Red sleeper LEDs (RS), one Green sleeper LED (GS) and one Blue sleeper LED (BS). The inactive part of the array of LEDs 107 also includes two inactive UV LEDs (US). If other wavelength sources are desired, the apparatus may include an active LED of the other type as well as a sleeper LED of the other type. The precise number, type, arrangement and mounting technique of the LEDs and the associated ports through the mask 101 or base 93 are not critical. The number of LEDs, for example, is chosen to provide a desired level of output energy (intensity) and range of color temperature or CRI, for a given application.

The system 90 includes a control circuit 61 and power source 63, similar to those in the example of FIG. 4a. These elements control the operation and output intensity of each LED 107. Although the active sources could be controlled in common and the inactive sources could be controlled in common, in the example, circuit 61 controls the intensities from the sources of different colors or wavelengths of energy separately and independently. The individual intensities determine the amount of each color light or energy wavelength introduced into the integrating cavity 95. The intensity levels of those wavelengths that pump the phosphor dopants also determine the amount of each type of visible light supplied by the phosphor dopants. These intensity levels in turn control the amount of each color of visible light included in the combined output and distributed output.

Masks are common in lighting systems, and not all masks necessarily tailor the output distribution in accord with principles of constructive occlusion. The present concepts relating to use of phosphor doped external reflectors to generate white light from semiconductor sources are applicable to such other lighting systems with masks. Consider the system 110 of FIGS. 8 and 9 as a representative example.

The system 110 may include one energy source package as in the example of FIG. 1, for emitting radiant energy of the first wavelength. In the illustrated example of FIGS. 8 and 9, the system includes a plurality (e.g. four) energy sources 115, at least one of which emits the energy of the first wavelength. Typically, one of the sources 115 emits blue or white or ultraviolet radiation, although others of the sources may emit visible light of different wavelengths. For discussion purposes, it is assumed that the sources 115 are LEDs, one of which is a UV LED, one is Green, one is Red and one is Blue. Except for the wavelength or color of the energy produced, each source 115 is generally similar and of the general type discussed above relative to FIG. 2, although other semiconductor devices may be used.

Figure 8:
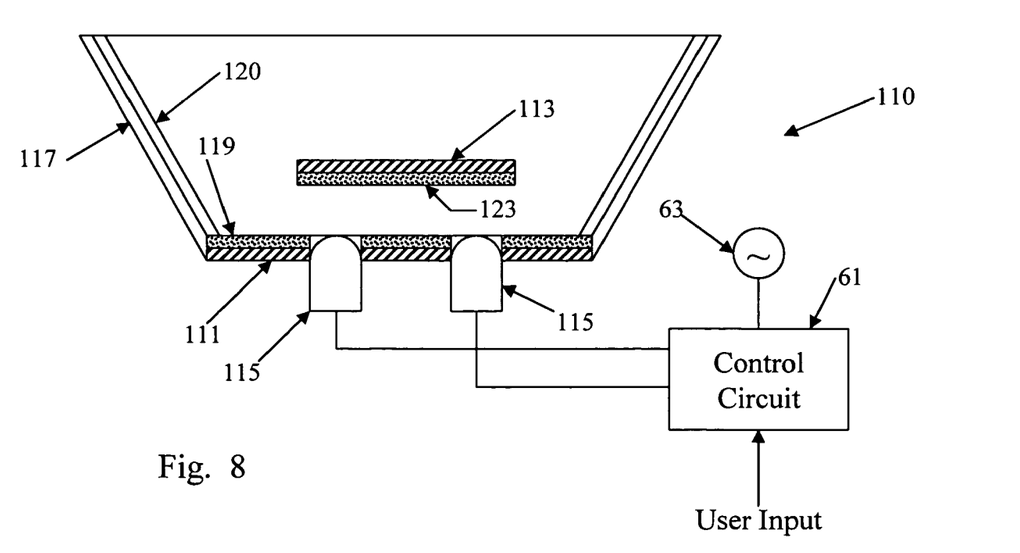
FIG. 8 illustrates an example of another white light emitting system, with certain elements thereof shown in cross-section.

The system 110 utilizes a reflector 117, located outside the energy source packages 115. The reflector 117 has a reflective surface 119 arranged to receive at least some radiant energy from the energy source packages 115. In the example, the emitting region of each source 115 fits into or extends through an aperture in a back section 111 of the reflector 117. The sources 115 may be coupled to the reflector 117 in any manner that is convenient and/or facilitates a particular illumination or luminance application of the system 110, as discussed above relative to the example of FIG. 1.

The inner surface 119 of the reflector, at or near the region supporting the LEDs 115 is doped with phosphor of a type pumped by at least one wavelength emitted by the LEDs. In the example, the surface 119 is diffusely reflective. The surface 120 of the sidewall of the reflector 117 are reflective with respect to at least visible light. The surface 120 may be diffusely reflective and doped in a manner similar to the material forming the surface 119, or the surface 120 may have different reflectivity and different or no doping. Materials for forming the reflector 117 and the phosphor dopants are similar to those used in the earlier examples.

The lighting system 110 uses a second reflector forming a mask 113, positioned between the energy source packages 115 and a region to be illuminated by the visible light from the system, so as to mask view of the energy source package by any person in that region. Unlike the constructive occlusion examples, the mask 113 is actually within the space or cavity formed by the first reflector. The base material used to form the reflector 113 may be any convenient one of the materials discussed above for forming reflectors. The surface 123 facing toward the source packages 115 is reflective. Although it may have other reflective characteristics, in the example, the surface 123 is diffusely reflective. At least the surface 123 facing toward the source packages 115 is doped with phosphor of a type pumped by at least one wavelength emitted by the LEDs, although the phosphor(s) used may differ from the doping in the material forming the surface 119. Exemplary phosphors that may be used have been discussed above.

The system 110 includes a control circuit 61 and power source 63, similar to those in several of the earlier examples. These elements control the operation and output intensity of each LED 115. The individual intensities determine the amount of each color light or energy wavelength introduced into the space between the reflectors 113 and 111. The intensities of those wavelengths that pump the phosphor dopants also determine the amount of each type of visible light supplied to the integrating space by the phosphor dopants. The various intensity levels in turn control the amount of the different colors of visible light included in the combined output emitted and distributed by the visible lighting system 10, whether for an illumination application or a luminance application perceptible by one or more people.

The mask 113 serves to control glare from the sources 115 and/or to provide visual comfort to a person observing the fixture. From many angles, such an observer will not directly view the bright light sources 115. To maintain fixture efficiency, the mask 113 may be sized and positioned so as to impact efficiency as little as possible and not significantly affect field of view (FOV) or light distribution. The diffuse reflection between the surfaces 119 and 123, however, does provide some light integration, and the phosphor pumping of the various dopants in these surfaces does provide additional wavelengths and/or increases in particular wavelengths in the combined light output, as in the earlier embodiments.

Figure 9:
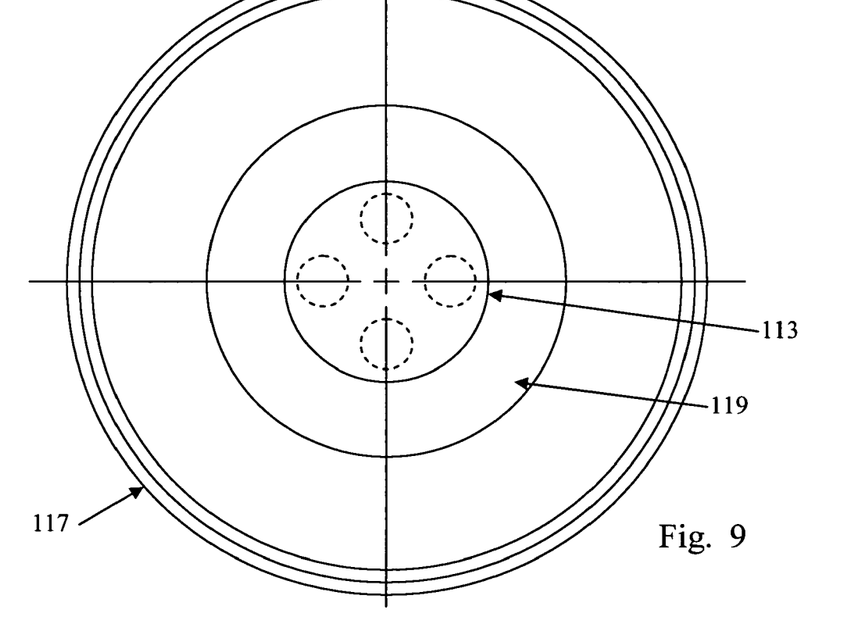
FIG. 9 is a top view of the fixture used in the system of FIG. 8.

The example of FIGS. 8 and 9 is a circular example and utilizes relatively flat reflective surfaces. Those skilled in the art will recognize that the principles of that example are applicable to systems of other shapes and configurations and to systems using various curved reflective surfaces (e.g. hemispherical, semi-cylindrical, parabolic, etc.).

Several of the systems disclosed above utilize two or more phosphors. In two phosphor examples, a first phosphor is excited by radiant energy of the first wavelength to emit visible light comprising light energy of the second wavelength. The second phosphor is of a type different from the first type, so that excitation of the second phosphor causes that dopant to emit visible light comprising light energy of a third wavelength different from the first and second wavelengths. A three phosphor implementation would include a third phosphor of yet another type. Excitation of the third phosphor causes it to emit visible light comprising light energy of a fourth wavelength different from the first, second and third wavelengths. The phosphor emissions contribute additional visible light colors over a broad spectrum. As shown above, these emissions may be supplemented with visible light from additional semiconductor sources. System reflections combine the visible light from the phosphors and/or visible light sources to produce a desired quality of white light output.

Those skilled in the art will recognize that the teachings outlined above may be modified and expanded in a variety of ways to adapt the disclosed systems to various humanly perceptible lighting applications. For example, the discussions above assumed that substantially all radiant energy impacting on an external reflector was either reflected or served to excite the phosphor dopants for reemission in direction(s) similar to diffuse reflections. For some applications, however, it may be desirable to allow some degree of transmissivity through the reflector, to provide a diffuse white light emission in another direction or toward another desired area of intended illumination.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present concepts.

What is claimed is:

1. A lighting system, for emitting visible light so as to be humanly perceptible, the lighting system comprising:
   an energy source package, for emitting radiant energy of a first wavelength;
   a reflector outside the energy source package, having a reflective surface arranged to receive radiant energy from the energy source package, wherein the reflective surface exhibits a diffuse reflectivity and forms an optical integrating cavity with an aperture for emission of combined radiant energy;
   at least one phosphor doped within the reflector, such that radiant energy of the first wavelength from the energy source package excites the at least one phosphor to emit visible light, comprising visible light energy of at least one second wavelength different from the first wavelength, wherein at least some of visible light emitted by the at least one phosphor is reflected by the reflective surface of the reflector; and
   a deflector having an inner reflective surface coupled to the aperture of the optical integrating cavity,
   wherein the lighting system directs at least the visible light emitted by the at least one phosphor so that it can be perceived by a person.

2. The lighting system of claim 1, wherein the energy source package comprises a semiconductor device for emitting the radiant energy of the first wavelength and an enclosure for the semiconductor device.

3. The lighting system of claim 2, wherein the semiconductor device comprises a light emitting diode for emitting at least some ultraviolet (UV) radiation.

4. The lighting system of claim 2, wherein the semiconductor device comprises at least one light emitting diode for emitting at least some blue light.

5. The lighting system of claim 1, wherein:
   the energy source package includes a source of blue light; and
   the system further comprises a source of visible red light and a source of green light arranged to emit at least some visible red light and green light for reflection from the reflective surface of the reflector.

6. The lighting system of claim 1, wherein:
   the energy source package includes a source of ultraviolet (UV) radiant energy; and
   the system further comprises a source of visible red light, a source of green light and a source of blue light arranged to emit at least some visible red, green and blue light for reflection from the reflective surface of the reflector.

7. A lighting system, for emitting visible light so as to be humanly perceptible, the lighting system comprising:
   an energy source package, for emitting radiant energy of a first wavelength;
   a reflector outside the energy source package, having a reflective surface arranged to receive radiant energy from the energy source package; and
   at least one phosphor doped within the reflector, such that radiant energy of the first wavelength from the energy source package excites the at least one phosphor to emit visible light, comprising visible light energy of at least one second wavelength different from the first wavelength, wherein:
   at least some of visible light emitted by the at least one phosphor is reflected by the reflective surface of the reflector, and the lighting system directs at least the visible light emitted by the at least one phosphor so that it can be perceived by a person;
   the reflective surface exhibits a diffuse reflectivity;
   the reflective surface forms a diffusely reflective cavity having an aperture; and
   the lighting system further comprises a mask outside the cavity, having a reflective surface facing toward the aperture of the cavity and arranged to occlude a substantial portion of the aperture.

8. A lighting system for emitting visible light so as to be humanly perceptible, the lighting system comprising:
   an energy source package, for emitting radiant energy of a first wavelength;
   a reflector outside the energy source package, having a reflective surface arranged to receive radiant energy from the energy source package;
   at least one phosphor doped within the reflector, such that radiant energy of the first wavelength from the energy source package excites the at least one phosphor to emit visible light, comprising visible light energy of at least one second wavelength different from the first wavelength,
   wherein at least some of visible light emitted by the at least one phosphor is reflected by the reflective surface of the reflector, and the lighting system directs at least the visible light emitted by the at least one phosphor so that it can be perceived by a person; and
   a second reflector positioned between the energy source package and a region to be illuminated by the visible light from the system so as to mask view of the energy source package by the person.

9. The lighting system of claim 8, further comprising at least one phosphor doped within the second reflector, such that radiant energy excites the phosphor in the second reflector to emit visible light, comprising visible light energy of a wavelength different from the first wavelength.

10. A lighting system, for emitting visible light so as to be humanly perceptible, the lighting system comprising:
   an energy source package, for emitting radiant energy of a first wavelength;
   a reflector outside the energy source package, having a reflective surface arranged to receive radiant energy from the energy source package; and
   at least one phosphor doped within the reflector, such that radiant energy of the first wavelength from the energy source package excites the at least one phosphor to emit visible light, comprising visible light energy of at least one second wavelength different from the first wavelength,
   wherein at least some of visible light emitted by the at least one phosphor is reflected by the reflective surface of the reflector, and the lighting system directs at least the visible light emitted by the at least one phosphor so that it can be perceived by a person, and wherein the at least one phosphor doped within the reflector comprises:

a first phosphor of a type which is excited by radiant energy of the first wavelength to emit visible light comprising light energy of the second wavelength; and a second phosphor of a type different from the first type, which is excited to emit visible light comprising light energy of a third wavelength different from the first and second wavelengths.

11. The lighting system of claim 10, wherein the at least one phosphor doped within the reflector further comprises a third phosphor of a type which is excited to emit visible light comprising light energy of a fourth wavelength different from the first, second and third wavelengths.

12. The lighting system of claim 10, wherein the energy source package comprises a semiconductor device for emitting at least some ultraviolet (UV) radiation.

13. The lighting system of claim 10, wherein the energy source package comprises a semiconductor device for emitting at least some blue light.

14. A lighting system, for emitting visible light, the lighting system comprising:

a structure forming an optical integrating cavity comprising a material forming a diffusely reflective inner surface of the cavity and at least one passage for emission of radiant energy integrated by diffuse reflection within the cavity;

a light emitting semiconductor device, coupled for emission of radiant energy comprising a first wavelength into the cavity; and at least one phosphor doped into the material forming the diffusely reflective inner surface of the cavity, the at least one phosphor being of a type excited by radiant energy of the first wavelength for emission of visible light of at least one second wavelength different from the first wavelength for reflection and integration within the cavity so as to be included in light emitted through the at least one passage, wherein:

the light emitting semiconductor device comprises a plurality of light emitting diodes (LEDs);

a first one of the LEDs emits radiant energy of a first character; and a second one of the LEDs emits radiant energy of a second character, different from the first character.

15. The lighting system of claim 14, wherein:

the a first light emitting diode (LED) is within an enclosure; and the reflective inner surface of the cavity is outside the enclosure of the first LED.

16. The lighting system of claim 15, wherein the first LED comprises a white, blue or ultraviolet (UV) LED.

17. The lighting system of claim 14 wherein:

the radiant energy from the first LED comprises light of a first color; and the radiant energy from the second LED comprises light of a second color different from the first color.

18. The lighting system of claim 17, wherein a third one of the LEDs emits radiant energy comprising light of a third color different from the first and second colors.

19. The lighting system of claim 18, wherein at least two of the colors of light are visible colors.

20. The lighting system of claim 18, wherein the system forms a fixture for illuminating an area to be inhabited by a person.

21. The lighting system of claim 18, wherein the system forms a fixture for providing luminance to be observed by a person.

22. The lighting system of claim 14, further comprising a substrate for the cavity, wherein the material forming the diffusely reflective inner surface of the cavity comprises a coating formed on the substrate.

23. The lighting system of claim 14, wherein the material forming the diffusely reflective inner surface of the cavity comprises a substantially white plastic.

24. A lighting system, for emitting visible light, the lighting system comprising:

a structure forming an optical integrating cavity comprising a material forming a diffusely reflective inner surface of the cavity and at least one passage for emission of radiant energy integrated by diffuse reflection within the cavity;

a light emitting semiconductor device, coupled for emission of radiant energy of a first wavelength into the cavity; and at least one phosphor doped into the material forming the diffusely reflective inner surface of the cavity, the at least one phosphor being of a type excited by radiant energy of the first wavelength for emission of visible light of at least one second wavelength different from the first wavelength for reflection and integration within the cavity so as to be included in light emitted through the at least one passage, wherein the structure forming the optical integrating cavity comprises a base with a diffusely reflective surface and a mask with a reflective surface facing toward the diffusely reflective surface of the base, wherein at least portions of the reflective surfaces of the base and the mask form the reflective inner surface of the optical integrating cavity.

25. The lighting system of claim 24, wherein the reflective surface of the mask is diffusely reflective.

26. A lighting system, for emitting visible light, the lighting system comprising:

a structure forming an optical integrating cavity comprising a material forming a diffusely reflective inner surface of the cavity and at least one passage for emission of radiant energy integrated by diffuse reflection within the cavity;

a light emitting semiconductor device, coupled for emission of radiant energy of a first wavelength into the cavity; and at least one phosphor doped into the material forming the diffusely reflective inner surface of the cavity, the at least one phosphor being of a type excited by radiant energy of the first wavelength for emission of visible light of at least one second wavelength different from the first wavelength for reflection and integration within the cavity so as to be included in light emitted through the at least one passage, wherein the at least one phosphor doped into the material forming the diffusely reflective inner surface of the cavity comprises:

a first phosphor of a type which is excited by radiant energy of the first wavelength to emit visible light comprising the second wavelength; and a second phosphor of a type different from the first type, which is excited to emit visible light of a third wavelength different from the first and second wavelengths.

27. The lighting system of claim 26, wherein the at least one phosphor doped into the material forming the diffusely reflective inner surface of the cavity further comprises a third phosphor of a type which is excited to emit visible light of a fourth wavelength different from the first, second and third wavelengths.

28. The lighting system of claim 26, wherein the light emitting semiconductor device comprises a light emitting diode for emitting at least some ultraviolet (UV) radiation.

29. The lighting system of claim 28, wherein the light emitting semiconductor device comprises a light emitting diode for emitting at least some blue light.

30. A method of producing substantially white light for an application visible by a person, the method comprising:
generating light of a first wavelength;
impinging at least a portion of the light of the first wavelength on a diffusely reflective surface of a doped material;
exciting a first phosphor within the doped material with a first portion of the light of the first wavelength impinging on the diffusely reflective surface, so that the first phosphor emits visible light of a second wavelength different from the first wavelength;
exciting a second phosphor within the doped material with radiant energy, so that the second phosphor emits visible light of a third wavelength different from the first and second wavelengths;
diffusely reflecting at least some of the light of the first wavelength from the diffusely reflective surface, so as to combine light of the first wavelength with the light of the and second and third wavelengths to form the substantially white light; and
emitting the substantially white light toward a region intended to be illuminated for the application visible by the person.

31. The method of claims 30, wherein the radiant energy exciting the second phosphor comprises a second portion of the light of the first wavelength impinging on the diffusely reflective surface.

32. The method of claims 30, wherein the radiant energy exciting the second phosphor comprises radiant energy of a wavelength different from the first wavelength.

33. The method of claim 30, wherein the diffusely reflective surface is a surface of an optical integrating cavity.

* * * * *